United States Patent [19]

Tam et al.

[11] Patent Number: 4,507,078
[45] Date of Patent: Mar. 26, 1985

[54] WAFER HANDLING APPARATUS AND METHOD

[75] Inventors: Johann Tam, Saratoga; Jalal Ashjaee, Mountain View; Nobuo B. Kuwaki, San Jose; Tuan M. Ngo, Milpitas; Susan W. Kung, Oakland, all of Calif.

[73] Assignee: Silicon Valley Group, Inc., San Jose, Calif.

[21] Appl. No.: 479,197

[22] Filed: Mar. 28, 1983

[51] Int. Cl.³ ............ F27D 3/00; F27B 9/14; B65G 43/00; B65G 15/00
[52] U.S. Cl. .................... 432/11; 198/341; 198/344; 198/345; 198/627; 432/122
[58] Field of Search .......... 432/11, 122, 124; 198/341, 344, 345, 627

[56] References Cited

U.S. PATENT DOCUMENTS

| | | | |
|---|---|---|---|
| 3,044,297 | 7/1962 | Hanken | 432/36 |
| 3,870,460 | 3/1975 | Flint | 432/11 |
| 4,217,977 | 8/1980 | Tam | 198/341 |
| 4,276,603 | 6/1981 | Beck et al. | 432/36 |

*Primary Examiner*—John J. Camby
*Attorney, Agent, or Firm*—Donald C. Feix

[57] ABSTRACT

A wafer handling method and apparatus insures proper centering of a wafer at a work station and controls the heat transferred to the wafer in a baking operation. The amount of heat transferred and the rate at which the heat is transferred to the wafer are regulated by controlling the distance between the wafer and a hot plate. The hot plate is maintained at a constant temperature higher than the bake out or equilibrium temperature to which the wafer is to be heated.

26 Claims, 13 Drawing Figures

WAFER HANDLING APPARATUS AND METHOD

BACKGROUND OF THE INVENTION

This invention relates to wafer handling methods and apparatus.

This invention has particular application to methods and apparatus for insuring centering of a wafer at a work station and to methods and apparatus for heating a wafer to bake off fluids such as, for example, solvents used in applying a photoresist to the wafer or liquids used in washing or cleaning the wafer.

In the processing of silicon wafers used in the manufacture of semiconductors there are a number of operations which require fluids to be removed from the wafer before subsequent processing steps can be carried out.

For example, after a layer of photoresist has been centrifugally spun onto the wafer, the solvents in the photoresist are driven out by baking. In automated equipment for processing wafers this bake operation, referred to as a "soft bake", is often performed in an oven by radiation baking.

Another application which requires baking is the removal of unwanted portions of the photoresist material after the patterns are exposed onto the photoresist. The unwanted material is washed away, and after this operation the wafer is baked in a "hard bake" operation to make the photoresist that remains impervious to etchents.

There is also a "dehydration bake" operation. This is used to remove residual moisture that remains on the wafer after a wafer is washed and cleaned by water or detergent.

There has been a trend to go to conduction baking (putting the wafer on a hot plate) to bake off the fluid rather than to use radiation baking in ovens. The machinery used for hot plate baking can be made smaller than the radiation oven, and floor space is often at a premium in wafer processing production.

Controlling the temperature rise time to the equilibrium or bake out temperature of the wafer with a hot plate can present problems. If the rise time is too quick, bubbles may form in the photoresist material; and if the rise time is too slow, the time for the baking operation is unduly extended.

It is an important object of the present invention to use a hot plate to bake a wafer in a way that provides close control of the wafer temperature at every point in the heating cycle and that also permits flexibility in the way the wafer is brought up to the equilibrium or bake out temperature while minimizing the total time required for the baking operation.

It is a specific object of the present invention to heat the wafer by a proximity baking technique in which the amount of heat transferred to the wafer and the rate at which the heat is transferred to the wafer are determined by the distance between the wafer and the hot plate.

It is another specific object of the present invention to run the hot plate at a constant temperature higher than the highest temperature to which the wafer is to be heated, so that the hot plate, in effect, serves as an overdriven source and the temperature control of the wafer is obtained either by proximity programmed or by measured temperature responsive servo control of the distance between the wafer and the hot plate.

It is another object of the present invention to heat the wafer by method and apparatus which do not require contact of the wafer with either the hot plate or a pyrometer for measuring the temperature of the wafer.

For most wafer processing operations at a work station, accurate centering of the wafer with respect to the center of the work station is important. For example, centering is critical in spinning operations.

It is another important object of the present invention to locate a pair of sensors at the work station in locations which detect the presence of the wafer at the work station area and which co-act with the wafer transport mechanism and controller to insure that the wafer is properly centered before the wafer is lifted from the wafer transport mechanism at the work station for the start of a processing operation.

Using two sensors to make wafer centering independent of the position of the flat on the wafer is another object of the present invention.

SUMMARY OF THE INVENTION

A method and apparatus of heating a silicon wafer to bake off a solvent used in applying a photoresist to the wafer or to bake off a liquid used in washing or cleaning the wafer include a hot plate and a controlled positioning of the wafer with respect to the hot plate. The method and apparatus provide flexibility in the rate and the way in which the wafer is heated to the equilibrium or bake out temperature while minimizing the total amount of time required for the baking operation.

The hot plate has a large mass in comparison to the mass of the wafer and is maintained at a closely controlled, substantially constant temperature level which is higher than the equilibrium or bake out temperature level to which the wafer is to be heated.

The wafer is placed in close proximity to the hot plate at the beginning of the heating cycle, and the wafer is then repositioned relative to the hot plate to vary the thickness of the air gap between the wafer and the hot plate. The heating of the wafer is controlled as a function of the distance of the wafer from the hot plate.

The wafer handling method and apparatus of the present invention insure centering of the wafer at the work station by means of two wafer sensors located at the work station in locations effective to detect the presence of the wafer at the work station.

The sensors detect the presence of the leading part of the wafer as the wafer enters the work station area and signal a controller to slow down the speed of conveyor drive belts and the speed at which the wafer enters the work station area.

The sensors signal the controller to stop the drive belts when the trailing part of the wafer uncovers the optical paths of both of the sensors and the wafer is centered with the work station.

If the wafer is off-center with the work station, this off-center condition is sensed by the wafer sensors; and the wafer is forced back to center. The drive belts are driven at the slow speed while an edge of the wafer is engaged with a curved surface that permits the wafer to be rotated and shifted laterally until the wafer is centered and the optical paths of both sensors are unblocked by the recentered wafer.

Wafer handling methods and apparatus which incorporate the features noted above and which are effective to function as described above constitute further, specific objects of this invention.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWINGS

FIGS. 2-A through 2-C are top plan views taken along the line and in the direction indicated by the arrows 2—2 in FIG. 1. These Figs. show a sequence of operations involved in forcing an off center wafer into center with the center of the work station prior to lifting of the wafer off of the conveyor belts by the wafer support members at the work station.

FIG. 3 shows how the support members engage the wafer only at peripheral areas on the under side of the wafer leaving the top surface and the edge of the wafer free of contact by the support members. FIG. 3 also shows how the downstream support member has a vertical portion of greater height than the upstream support member for engagement with the wafer during the recentering operation shown in FIG. 2-B.

FIG. 4 shows the curved surface which permits the wafer to be rotated and shifted laterally until the wafer is centered in the operation illustrated in FIG. 2-B.

FIGS. 5-A through 5-C are a sequence of views taken generally along the line and in the direction indicated by the arrows 5—5 in FIG. 1. These views show how a wafer may be heated, in one method of the present invention, by initially engaging the wafer in contact with the hot plate at the beginning of the cycle to obtain an initial, rapid transfer of heat from the hot plate to the wafer (FIG. 5-A) and then by lifting the wafer out of contact with the hot plate and thereafter repositioning the wafer with respect to the hot plate at varying distances (FIGS. 5-B and 5-C) to maintain an air gap between the wafer and the hot plate and to regulate the heating of the wafer as a function of the distance of the wafer from the hot plate.

FIG. 6-A is a graph showing three different wafer temperature vs. time profiles obtained in accordance with the present invention by varying the proximity of the wafer to the hot plate during the heating cycle.

FIG. 6-B is a graph showing the variation of distance of the wafer from the hot plate for each of the three wafer temperature vs. time profiles shown in FIG. 6-A.

DESCRIPTION OF THE PREFERRED EMBODIMENTS

Figure 1:
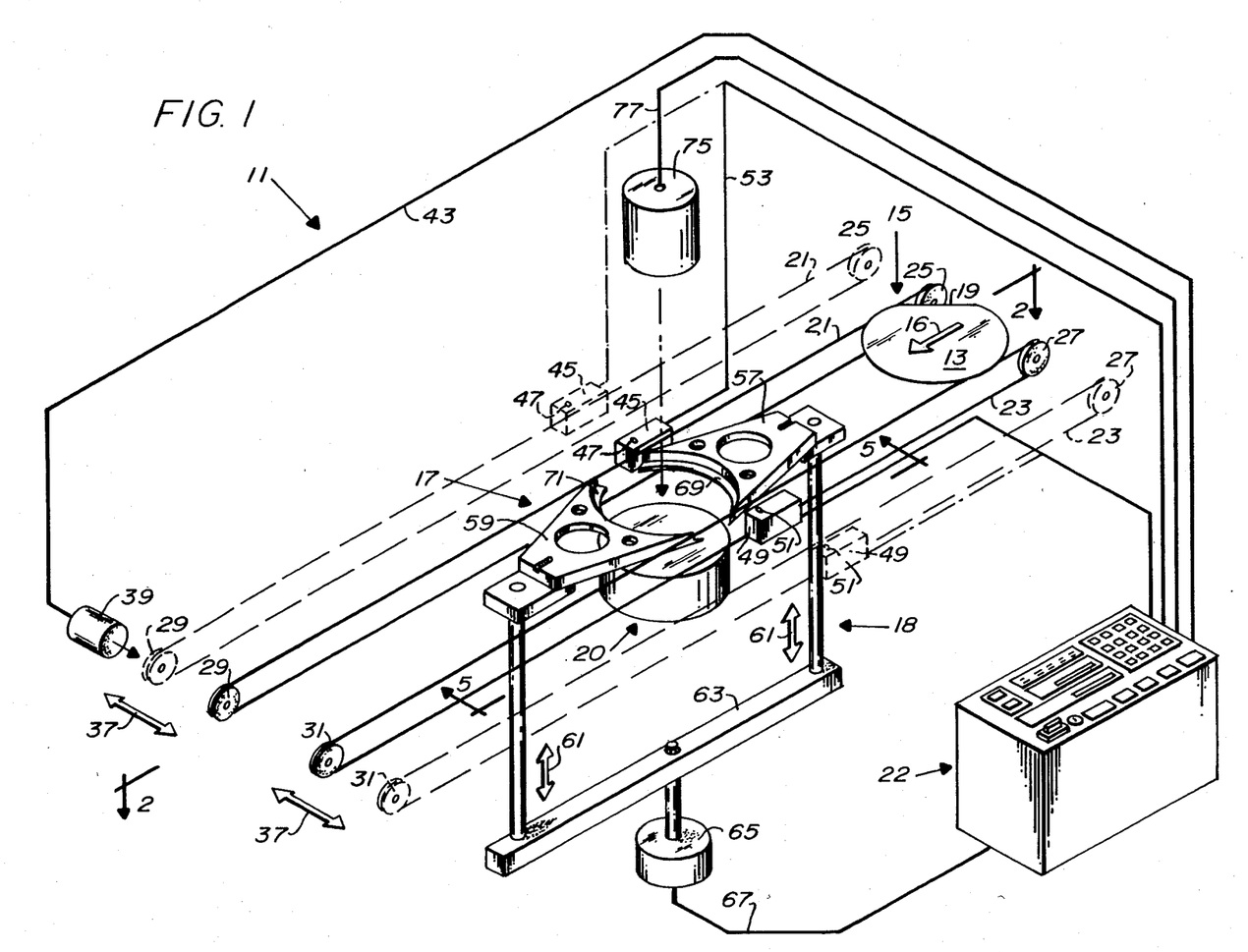
FIG. 1 is an isometric view of a wafer handling apparatus constructed in accordance with one embodiment of the invention. The wafer handling apparatus transports a silicon wafer to a work station, centers the wafer at the work station and bakes the wafer at the work station.

A wafer handling apparatus constructed in accordance with one embodiment of the present invention is indicated generally by the reference numeral 11 in FIG. 1.

The wafer handling apparatus 11 shown in FIG. 1 includes a wafer transport mechanism 15 for carrying a wafer 13 (in the direction indicated by the block arrow 16) to and away from a work station 17, a wafer lift mechanism 18 for raising and lowering the wafer at the work station, a hot plate 20 for baking the wafer at the work station, and a controller 22 for controlling the operation of the wafer handling apparatus 11. The controller 22 includes feedback means for adjusting the position of the wafer 13 with respect to the hot plate 20 in response to a measured temperature (as sensed by the temperature sensor 75 and as transmitted to the controller 22 on the line 77) to maintain a predetermined wafer temperature for each time interval of the heating cycle of the wafer. The controller 22 also includes logic means which are operatively associated with the drive means 39 for slowing down substantially the speed of the two belts 21 and 23 and the speed at which the wafer 13 is conveyed into the heating station area in response to the detecting of the entrance of the wafer 13 into the heating station and for stopping the two belts 21 and 23 and the wafer 13 when the trailing part of the wafer 13 uncovers the optical paths of both of the two sensors 47 and 51 and the signals transmitted from the sensors to the controller 22 on the lines 53. This mode of operation of the feedback means and the logic means of the controller 22 will become more apparent from the detailed description to follow.

FIG. 1 shows a silicon wafer 13 placed at the inlet end of the wafer transport mechanism 15 for transport to the work station 17.

The wafer 13 is a generally circular shaped wafer and usually has a flat 19 ground on the periphery.

The wafer transport mechanism 15 includes a pair of laterally spaced and parallel extending drive belts 21 and 23 trained over pulleys 25 and 27 at one end and over pulleys 29 and 31 at the other end.

In a preferred embodiment of the present invention the belts 21 and 23 are O ring belts.

Figure 2:
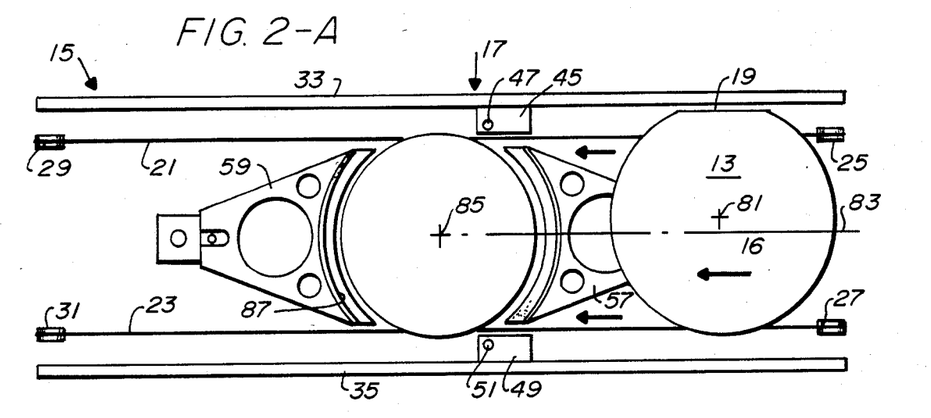

As illustrated in FIGS. 2-A through 2-C, the O ring belt 21 and associated pulleys 25 and 29 are mounted on a carriage 33; and the O ring belt 23 and associated pulleys 27 and 31 are mounted on a carriage 35.

The carriages 33 and 35 have inner surfaces which face the side edges of the wafer and which normally do not touch the wafer. However, if the wafer should be or become off center with respect to the centerline of the wafer transport system, the inner surfaces of the carriages 33 and 35 act as guides to push the center of the wafer back into alignment with the centerline of the wafer transport systems as the wafer is carried forward by the belts 21 and 23 toward the work station.

The carriages 33 and 35 are movable laterally toward and away from each other, in the directions indicated by the block arrows 37 (see FIG. 1), by carriage transport mechanism (not shown in the drawings of this application) to facilitate the carrying out of processing operations on the wafer at the work station 17.

The mechanism for moving the carriages 33 and 35 outwardly and inwardly as illustrated in FIG. 1 is illustrated and described in detail in U.S. Pat. No. 4,217,977 issued Aug. 19, 1980 and assigned to the same assignee as the assignee of this application; and this U.S. Pat. No. 4,217,977 is hereby incorporated by reference in this application.

With continued reference to FIG. 1, a drive motor 39 is connected to drive the pulleys 29 and 31. The details of the drive to the pulleys 29 and 31 are shown in the U.S. Pat. No. 4,217,977. The controller 22 controls the starting and stopping and the speed of rotation of the drive motor 39 through a line 43.

A wafer position sensor 45 having an upwardly facing detector element 47 is mounted on the carriage 33. In a preferred embodiment of the invention the sensor 45 is an optical sensor and the element 47 is a light responsive detector element. A similar wafer position sensor 49 having an upwardly facing light responsive detector element 51 is mounted on the carriage 35.

The sensors 45 and 49 are connected to the controller 22 by lines 53 and 55.

As will be described in more detail below, the O ring belts 21 and 23 are driven at the same speed. The speed is a relatively fast speed until the wafer enters the work station area, as sensed by the sensors 45 and 49. The belts 21 and 23 are then driven at a relatively slow speed until the wafer is centered in position over the center of the work station and the detectors 47 and 51 are uncovered by the back portion of the wafer. At that time the drive to the belts is stopped.

The wafer lift mechanism 18 comprises a pair of wafer support members, an upstream member 57 and a downstream member 59. The members 57 and 59 are raised and lowered (in the direction indicated by the block arrows 61) to lift the wafer 13 off of the O ring belts 21 and 23 (prior to a wafer processing operation at the work station 17) and to lower the wafer 13 back onto the O ring belts 21 and 23 (after the completion of the wafer processing steps at the work station 17).

The O ring belts 21 and 23 are moved outwardly (to the dotted line positions illustrated in FIG. 1) after the wafer 13 has been lifted off of the belts, and the O ring belts 21 and 23 are moved inwardly (to the solid line position shown in FIG. 1) after the completion of the processing operations on the wafer at the work station when the wafer 13 is lowered back onto the belts for transport away from the work station 17. The sequence (lifting the wafer off of the belts 21 and 23, movement of the related carriages outwardly, lowering of the wafer at the work station 17 for a processing operation, raising of the wafer above the belts 21 and 23 at the completion of a processing operation, movement of the belts inwardly, and lowering of the wafer back onto the belts for subsequent transport of the wafer away from the work station 17) is like that described in the above noted U.S. Pat. No. 4,217,977 incorporated by reference in this application.

In a specific embodiment of the present invention the support members 57 and 59 are connected to a yoke mechanism 63, and the vertical position of the yoke mechanism 63 is controlled by a linear actuator 65 connected to the controller 22 by a line 67.

As best illustrated in FIGS. 1, 3, 4 and 5, the support members 57 and 59 have arc shaped ledges 69 and 71 for engaging the wafer only at peripheral areas on the underside of the wafer to leave the top surface and peripheral edge of the wafer free of contact by the support members. This structure minimizes the risk of contaminants on the critical, upper surface of the wafer.

The work station 17 as shown in FIG. 1 is a heating station and is used to perform a baking operation on the wafer 13. The heating station 17 is used to perform any or all of the hard bake, soft bake and dehydration bake operations referred to above in the introductory part of this application.

A hot plate 20 is centrally positioned as illustrated in FIG. 1 at the heating station 17 to provide the heat for the bake operation on the wafer 13.

The hot plate 20 has a very large mass in comparison to the mass of the wafer, and the temperature of the hot plate is maintained at a constant temperature within narrow tolerances and at a level higher than the equilibrium or target temperature level to which the wafer is to be heated. The heating source for the hot plate 20 is not shown but is, in a preferred embodiment of the present invention, an electrical heating source.

A pyrometer 75 is mounted above the heating station 17 for measuring the temperature of the wafer 13. The pyrometer 75 in a preferred embodiment of the present invention measures the temperature by infrared radiation emitted from the heated wafer 13. The pyrometer transmits a signal indicating the measured temperature to the controller 22 by a line 77.

In the present invention the wafer is heated by a proximity baking technique. The amount of heat transferred to the wafer and the rate at which the heat is transferred to the wafer are determined by the distance between the wafer and the hot plate 20 and by the amount of time that the wafer is maintained at each distance from the hot plate.

The present invention provides close control of the wafer temperature at every point in the heating cycle and also permits great flexibility in the way in which the wafer is brought up to the equilibrium or bake out temperature, as will be more apparent from the description which follows.

Because the hot plate 20 has a large mass (a giant mass in comparison to the mass of the wafer) and is maintained at a temperature level higher than that of the highest temperature to which the wafer is to be heated, the hot plate 20 provides a constant temperature heating source which is easy to control and which, in effect, serves as an overdriven source.

The control of the wafer temperature and the rate at which the wafer temperature is changed are dependent only on the proximity (the distance) between the wafer and the hot plate.

Figure 5:
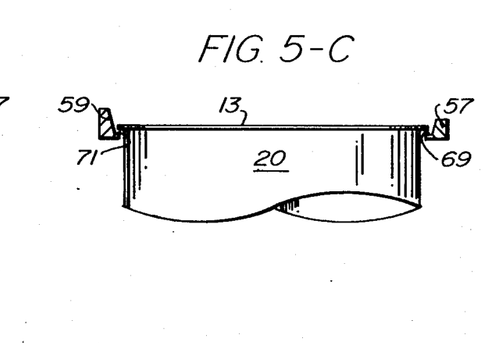

The wafer can be placed in direct contact with the hot plate (as illustrated in FIG. 5-A), and this produces the fastest rate of heat transfer from the hot plate to the wafer.

If a slower rate of heat transfer is desired than the rate of transfer provided by direct contact with the hot plate, the wafer 13 is held slightly above the hot plate and is separated from the hot plate by an air gap 79 of small thickness (as illustrated in FIG. 5-B).

By increasing the thickness of the air gap 79 (as illustrated in 5-C), the rate at which heat is transferred to the wafer is further reduced.

Figure 6:
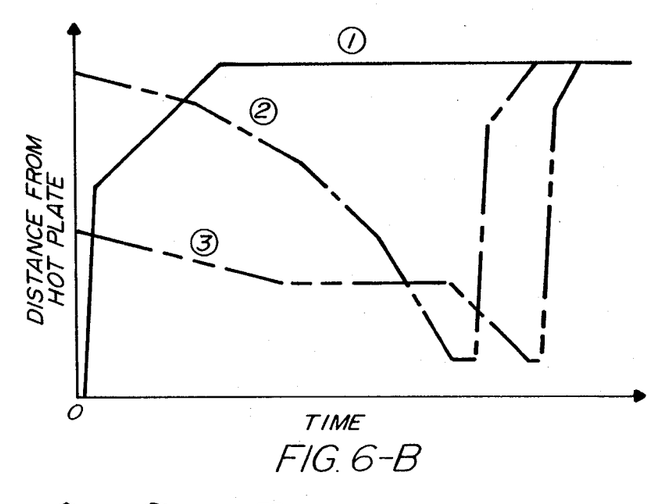

Thus, by varying the distance of the wafer from the hot plate with time in the ways illustrated by the curves numbered 1, 2, and 3 in FIG. 6-B, the wafer temperature rise time varies in the ways shown in the correspondingly numbered curves 1, 2, and 3 in FIG. 6-A.

Figure 7:
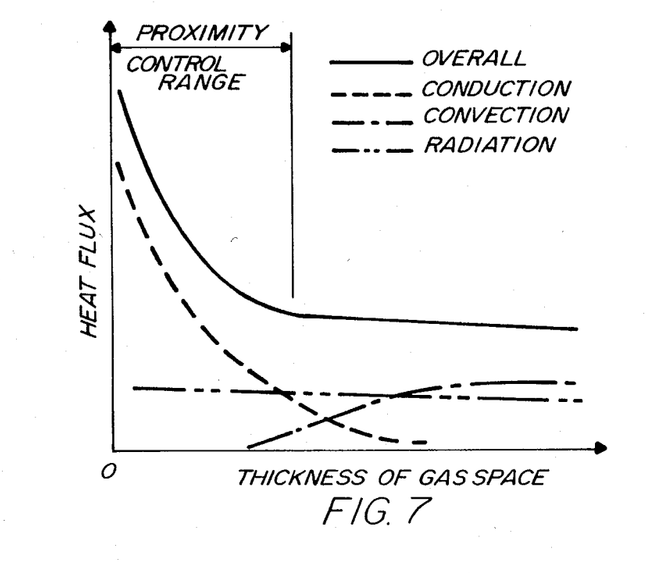
FIG. 7 is a graph showing the variation of the heat flux between two constant-temperature parallel plates as a function of the thickness of a gas space between the plates.
Figure 8:
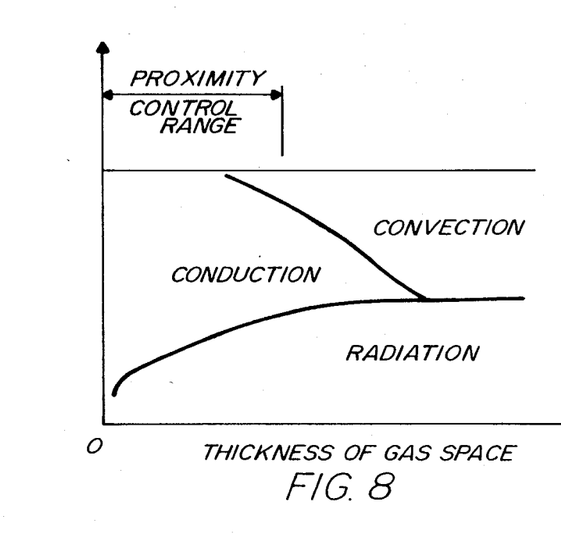
FIG. 8 is a graph showing the relative percentage contributions of heating by conduction, convection and radiation with changes in the thickness of the gas space between a hot plate and a wafer in the preferred range of spacings provided by the apparatus and method of the present invention.

It may be noted that, while the wafer is shown as initially engaged directly with the hot plate (as shown by curve 1 in FIG. 6-B), a fast rise time can also be obtained without contacting the wafer with the hot plate. At small thicknesses of the gap 79 between the wafer and the hot plate the primary mechanism of heat transfer is conduction (as shown in FIG. 8); and (as shown in FIG. 7) a high amount of heat flux is transferred across a thin gap without direct contact. In some applications baking of the wafer without any contact with the hot plate is preferred to minimize the risk of contamination. The present invention accomodates baking without contact while still permiting a fast rise of temperature, if a fast rise is desired.

The present invention permits the temperature-time profile either to be scheduled as a set of distance instructions supplied to the controller 22 or to be controlled by a temperature measuring servo technique for comparison with adherence to a time temperature profile instruction supplied to the controller 22. In the later case, the actual temperature of the wafer (as measured by the pyrometer 75) is compared to the scheduled temperature for that point in time in the bake cycle, and the controller 22 signals a linear actuator 65 to make any necessary adjustment (either upwardly or downwardly) to reposition the wafer to conform the actual temperature to the scheduled temperature.

As indicated by the legend "proximity control range" in FIGS. 7 and 8, the preferred range of control in the present invention is within the range in which conduction provides a substantial contribution to the amount of heat transferred and in which convection provides either no contribution or substantially little contribution to the amount of heat transferred.

In a specific embodiment of the present invention the control range for the spacing between the wafer and the hot plate is approximately 8 inches, and the linear actuator 65 responds to electronic pulses from a microprocessor chip drive on a central processing unit board within the controller 22 to move the wafer support members 57 and 59 vertically up and down to any of approximately 500 discrete levels, spaced 0.002 inches apart.

Proper centering of the center of the wafer with the center of the work station is important in a wafer baking operation; and it is also important in other wafer processing operations, particularly those operations in which it is necessary to rotate the wafer.

In the wafer transport apparatus 11 illustrated in FIG. 1 the center of the wafer 13 is normally maintained on a line coincident with the center of the wafer transport mechanism 15 by the accuracy with which the wafer 13 is originally placed on the belts 21 and 23.

As noted above, the wafer transport mechanism 15 includes guides alongside the belts 21 and 23 for contacting the wafer 13 to put the center back on line in the event the center should become off line at some point in the transport on the belts 21 and 23.

The present invention also incorporates a fail safe mechanism and mode of operation for centering the wafer at the work station 17 in the event the wafer should get off center at that point in the handling of the wafer. Thus, if the water handling apparatus 11 is jarred and the wafer becomes uncentered at this point in time, the present invention provides a method and apparatus for forcing the wafer 13 back into center at the work station. This apparatus and method are illustrated in FIGS. 2-A through 2-C, FIG. 3 and FIG. 4.

FIG. 2-A shows the wafer 13 having its center 81 displaced from center line 83 of the wafer transport mechanism and from the center 85 of the work station 17.

FIG. 2-A also shows the worst possible case (the flat 19 at one side) for maintaining cenering of the wafer by the guides on the carriages 33 and 35.

The recentering of the off center wafer 13 shown in FIG. 2-A is accomplished by the co-action of the optical sensors 45 and 49, logic in the controller 22 which receives signals from the sensors, the drive of the belts 21 and 23, and a curved surface 87 on the downstream wafer support member 59.

In normal operation of the wafer handling apparatus 11 with a properly aligned wafer 13 on the drive belts 21 and 23, the leading portion of the wafer 13 passes over the optical paths of the detectors 47 and 51 as the wafer is transported to the work station 17. The sensors 45 and 49 then send signals to the controller (over the lines 53 and 55), and the controller 22 slows down the drive motor for the belts 21 and 23 substantially so that wafer 13 proceeds into the work station area at a relatively slow rate of speed. When the trailing portion of the wafer 13 uncovers the optical paths of the detectors 47 and 51, the sensors 45 and 49 signal the controller 22, and the logic in the controller 22 shuts off the drive to the belts 21 and 23 so that the wafer 13 is stopped at the work station with its center 81 coincident with the center 85 of the work station.

The use of two sensors in the present invention insures centering of the wafer regardless of the orientation of the flat 19 and insures that the wafer is centered at the work station in a way that is not possible with the use of a single sensor. In the orientation of the flat 19 shown in FIG. 2-A (with the flat at the 12 o'clock position) the wafer can be off-center by a maximum amount. The present invention detects this off-centering, and the two sensors function to insure that the wafer is properly centered at the work station as described in more detail below. If, however, the flat 19 were at the 2 o'clock position, the wafer could actually be on-center with the center line of the wafer transport apparatus, but might not be fully transported to the actual center of the work station if a single sensor (instead of the two sensors of the present invention) were used to control the drive of the belts. That is, if the flat 19 were at the 2 o'clock position and uncovered the single sensor at the work station, the wafer transport mechanism would stop before the center 81 of the wafer actually was moved over the center 85 of the work station. The use of two sensors in the present invention insures that exact coincidence centering of the center 81 of the wafer and the center 85 of the work station is always achieved, because both sensors must be uncovered before the drive is stopped.

When the wafer 13 is off center (as illustrated in FIG. 2-A), one of the detectors (in this case detector 47) remains covered. This results in the drive to the belts being continued (at the slow speed) until both of the detectors 47 and 51 are uncovered.

In the condition illustrated in FIG. 2-B, the wafer 13 is rotated (in the direction indicated by the block arrow 87 in FIG. 2-B). This occurs because the edge of the wafer 13 is engaged with that portion of the curved surface 87 of the downstream support member 59 which extends above the upper end of the upstream support 57. See FIG. 3 which shows this difference in height 89.

Figure 3:
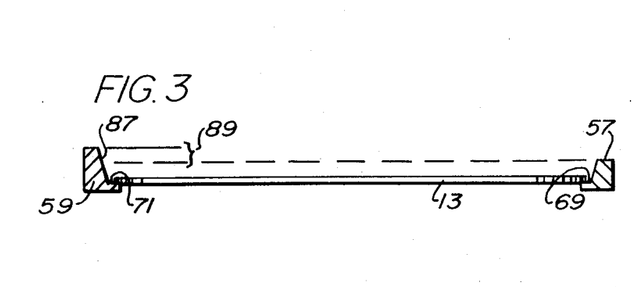
FIG. 3 is a fragmentary side elevation view, partly in cross section, taken along the line and in the direction indicated by the arrows 3—3 in FIG. 2-C, showing how the wafer is supported by the support members at the work station.
Figure 4:
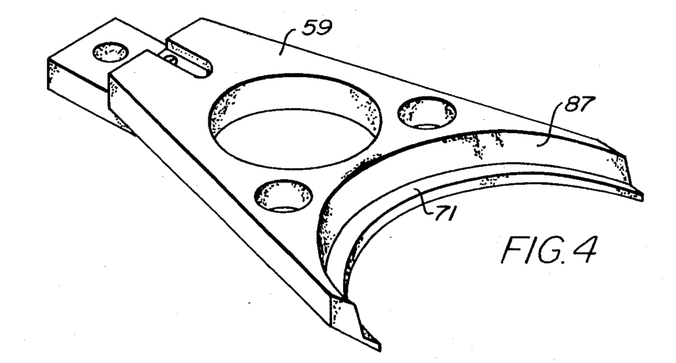
FIG. 4 is an enlarged isometric view of the downstream support member.

This difference in height permits the wafer 13 to pass over the top of the wafer support member 57 and still contact the surface 87 of the downstream support member 59 if the wafer is off center at this point in the wafer handling process.

The combination of the engagement of the edge of the wafer 81 with the curved surface 87, the shape of the curved surface 87 and the continued slow speed drive of the belts 21 and 23 causes the wafer to be rotated and shifted laterally until the center 81 of the wafer is aligned with the center 85 of the work station 17 in the condition illustrated in FIG. 2-C. At this time both of the detectors 47 and 51 are uncovered, and the controller 22 stops the drive of the belts 21 and 23.

In a specific embodiment of the present invention the curved surface 87 is a conically curved surface.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

We claim:

1. A method of heating a silicon wafer at varied rates of heating for a processing step of the kind in which it is necessary to bake off a solvent used in applying a photo resist to the wafer or to bake off a liquid used in washing or cleaning the wafer, said method comprising,
    maintaining a hot plate having a relatively large mass in comparison to the mass of the wafer at a substantially constant temperature level which is higher than the equilibrium or bake out temperature level to which the wafer is to be heated,
    positioning the wafer in close proximity to the hot plate at the beginning of the heating cycle to produce an initial rate of heating of the wafer,
    repositioning the wafer relative to the hot plate at any one of a wide range of selectable distances to vary the thickness of an air gap between the wafer and the hot plate and to change the rate of heating of the wafer from said initial rate,
    heating of the wafer as a function of the distance of the wafer from the hot plate by controlling the distance between the wafer and the hot plate.

2. The invention defined in claim 1 including heating the wafer without any contact between the wafer and the hot plate.

3. The invention defined in claim 1 including engaging the wafer in contact with the hot plate at the beginning of the heating cycle to obtain an initial, rapid transfer of heat from the hot plate to the wafer and then lifting the wafer out of contact with the hot plate and thereafter repositioning the wafer with respect to the hot plate to maintain an air gap between the wafer and the hot plate.

4. A method of heating a silicon wafer for a processing step of the kind in which it is necessary to bake off a solvent used in applying a photo resist to the wafer or to bake off a liquid used in washing or cleaning the wafer, said method comprising,
    maintaining a hot plate having a relatively large mass in comparison to the mass of the wafer at a substantially constant temperature level which is higher than the equilibrium or bake out temperature level to which the wafer is to be heated,
    positioning the wafer in close proximity to the hot plate at the beginning of the heating cycle,
    repositioning the wafer relative to the hot plate to vary the thickness of an air gap between the wafer and the hot plate and to regulate the heating of the wafer as a function of the distance of the wafer from the hot plate,
    measuring the temperature of the wafer without contacting the wafer by the temperature measuring means, and
    adjusting the position of the wafer with respect to the hot plate in response to the measured temperature of the wafer to maintain a predetermined wafer temperature for each time interval of the heating cycle of the wafer.

5. A method of heating a silicon wafer for a processing step of the kind in which it is necessary to bake off a solvent used in applying a photo resist to the wafer or to bake off a liquid used in washing or cleaning the wafer, said method comprising,
    maintaining a hot plate having a relatively large mass in comparison to the mass of the wafer at a substantially constant temperature level which is higher than the equilibrium or bake out temperature level to which the wafer is to be heated,
    positioning the wafer in close proximity to the hot plate at the beginning of the heating cycle,
    repositioning the wafer relative to the hot plate to vary the thickness of an air gap between the wafer and the hot plate and to regulate the heating of the wafer as a function of the distance of the wafer from the hot plate,
    measuring the temperature of the wafer without contacting the wafer by the temperature measuring means,
    heating the wafer at a heating station,
    conveying the wafer to the heating station on a pair of laterally spaced apart and parallel extending belts, and
    correcting any off centering of a wafer at the heating station by forcing the wafer into center with the center of the heating station by driving the belts while engaging an edge of the wafer with a curved surface that permits the wafer to be rotated and shifted laterally until the wafer is centered.

6. The invention defined in claim 5 including detecting any off centering of the wafer by two optical sensors located at the heating station and
    driving the belts at a relatively slow speed in response to the detection of the off center condition by the sensors until the wafer is centered.

7. The invention defined in claim 5 including supporting the wafer at the heating station by support members that engage the wafer only at peripheral areas on the underside of the wafer leaving the top surface and edge of the wafer free of contact by the support members.

8. A method of transporting and centering a silicon wafer at a work station, said method comprising,
    conveying the wafer to the work station on a pair of laterally spaced apart and parallel extending belts,
    positioning two wafer sensors at the work station in locations effective to detect the presence of portions of the leading part of the wafer directly above the sensors as the wafer enters the work station area and moves into the optical paths of the sensors,
    slowing down substantially the speed of the two belts and the speed at which the wafer is conveyed into the work station area in response to the detecting of the entrance of the wafer into the work station, and stopping the two belts and the wafer when the trailing part of the wafer uncovers the optical paths of both of the sensors.

9. The invention defined in claim 8 including correcting any displacement of the center of the wafer from the center line of the conveyor belts by guides located alongside the conveyor belts.

10. The invention defined in claim 9 including detecting any off centering of the wafer at the work station, and centering an off center wafer with the center of the work station by driving the belts while engaging an edge of the wafer with a curved surface that permits the wafer to be rotated and shifted laterally until the wafer is centered.

11. A method of transporting and centering a silicon wafer at a work station, said method comprising, conveying the wafer to the work station on a pair of laterally spaced apart and parallel extending belts, detecting any off centering of the wafer at the work station, and centering an off center wafer with the center of the heating station by driving the belts at a relatively slow speed while engaging an edge of the wafer with a curved surface that permits the wafer to be rotated and shifted laterally until the wafer is centered.

12. The invention defined in claim 11 wherein the curved surface has a conical curvature.

13. The invention defined in claim 11 including positioning two optical sensors at the work station in locations effective to detect the presence of a portion of the wafer directly above at least one of the sensors when the wafer is off center and effective to indicate no part of the wafer is directly above either of the sensors when the wafer is centered with the center of the work station.

14. Wafer heating apparatus for heating a silicon wafer at varied rates of heating during a processing step of the kind in which it is necessary to bake off a solvent used in applying a photo resist to the wafer or to bake off a liquid used in washing or cleaning the wafer, said apparatus comprising, a hot plate having a relatively large mass in comparison to the mass of the wafer, heating means for maintaining the temperature of the hot plate at a subsantially constant level which is higher than the equilibrium or bake out temperature level to which the wafer is to be heated, wafer support means for positioning the wafer in close proximity to the hot plate at the beginning of the heating cycle to produce an initial rate of heating of the wafer, and control means effective to reposition the wafer holder means and wafer at any one of a wide range of selectable distances relative to the hot plate to vary the thickness of an air gap between the wafer and the hot plate to change the rate of heating of the wafer from said initial rate and effective also to thereafter regulate the rate of heating of the wafer as a function of the distance of the wafer from the hot plate by controlling the distance between the wafer and the hot plate.

15. The invention defined in claim 14 wherein the wafer support means are positioned by the control means to heat the wafer without any contact between the wafer and the hot plate throughout the heating cycle.

16. The invention defined in claim 14 wherein the wafer support means are initially positioned by the control means to engage the wafer in contact with the hot plate at the beginning of the heating cycle to obtain an initial, rapid transfer of heat of the hot plate to the wafer and thereafter to reposition the wafer with respect to the hot plate to maintain an air gap between the wafer and the hot plate.

17. Wafer heating apparatus for heating a silicon wafer during a processing step of the kind in which it is necessary to bake off a solvent used in applying a photo resist to the wafer or to bake off a liquid used in washing or cleaning the wafer, said apparatus comprising, a hot plate having a relatively large mass in comparison to the mass of the wafer, heating means for maintaining the temperature of the hot plate at a substantially constant level which is higher than the equilibrium or bake out temperature level to which the wafer is to be heated, wafer support means for positioning the wafer in close proximity to the hot plate at the beginning of the heating cycle, control means for repositioning the wafer holder means and wafer relative to the hot plate to vary the thickness of an air gap between the wafer and the hot plate and to regulate the heating of the wafer as a function of the distance of the wafer from the hot plate, temperature measuring means for measuring the temperature of the wafer without contacting the wafer by the temperature measuring means, and wherein the control means include feedback means for adjusting the position of the wafer with respect to the hot plate in response to the measured temperature of the wafer to maintain a predetermined wafer temperature for each time interval of the heating cycle of the wafer.

18. Wafer heating apparatus for heating a silicon wafer during a processing step of the kind in which it is necessary to bake off a solvent used in applying a photo resist to the wafer or to bake off a liquid used in washing or cleaning the wafer, said apparatus comprising, a hot plate having a relatively large mass in comparison to the mass of the wafer, heating means for maintaining the temperature of the hot plate at a substantially constant level which is higher than the equilibrium or bake out temperature level to which the wafer is to be heated, wafer support means for positioning the wafer in close proximity to the hot plate at the beginning of the heating cycle, control means for repositioning the wafer holder means and wafer relative to the hot plate to vary the thickness of an air gap between the wafer and the hot plate and to regulate the heating of the wafer as a function of the distance of the wafer from the hot plate, and wherein the hot plate is a part of a heating station and including wafer transport means for conveying the wafer to the heating station, said wafer transport means comprising, a pair of laterally spaced apart and parallel extending belts, drive means for driving the belts, and detector means at the heating station for detecting both the entrance of a wafer into the heating station and the centering of the wafer with respect to the center of the center of the heating station.

19. The invention defined in claim 18 wherein the detector means include two optical sensors at the heating station located at positions effective to detect the presence of portions of the leading part of the wafer directly above the sensors as the wafer enters the heating station area and moves into the optical paths of the sensors, and logic means operatively associated with the drive means for slowing down substantially the speed of the two belts and the speed at which the wafer is conveyed into the heating station area in response to the detecting of the entrance of the wafer into the heating station and for stopping the two belts and the wafer when the trailing part of the wafer uncovers the optical paths of both of the two sensors.

20. The invention defined in claim 19 including guides along side the conveyor belts for correcting any displacement of the center of the wafer from the center line of the conveyer belts.

21. The invention defined in claim 19 wherein the two optical sensors detect any off centering of the wafer at the heating station and signal the logic means to continue to drive the belts in response to the detection of the off center condition and including wafer repositioning means for forcing the wafer into center with the center of the heating station during said driving of the belts, said wafer repositioning means having a curved surface that permits the wafer to be rotated and shifted laterally until the trailing part of the wafer uncovers the optical paths of both of the optical sensors.

22. Wafer handling apparatus for transporting and centering a silicon wafer at a work station, said apparatus comprising,
wafer transport means for conveying the wafer to the work station, said wafer transport means comprising a pair of laterally spaced apart and parallel extending belts,
drive means for driving the belts,
two wafer sensors at the work station in locations effective to detect the presence of portions of the leading part of the wafer directly above the sensors as the wafer enters the work station area and moves into the optical paths of the sensors,
logic means operatively associated with sensors and the drive means for slowing down substantially the speed of the two belts and the speed at which the wafer is conveyed into the work station area in response to the detecting of the entrance of the wafer into the work station and effective to stop the two belts and the wafer when the trailing part of the wafer uncovers the optical paths of both of the two sensors.

23. The invention defined in claim 22 including guide means located alongside the belts for correcting any displacement of the center of the wafer from the center line of the conveyor belts.

24. The invention defined in claim 22 wherein the two optical sensors detect any off centering of the wafer at the heating station and signal the logic means to continue to drive the belts in response to the detection of the off center condition and including wafer repositioning means for forcing the wafer into center with the center of the work station during said driving of the belts, said wafer repositioning means having a curved surface that permits the wafer to be rotated and shifted laterally until the trailing part of the wafer uncovers the optical paths of both of the optical sensors.

25. The invention defined in claim 22 including support means at the work station for engaging the wafer only at peripheral areas on the underside of the wafer to leave the top surface and the edge of the wafer free of contact by the support means.

26. Wafer handling apparatus for transporting and centering a silicon wafer at a work station, said apparatus comprising,
conveyor means for conveying the wafer to the work station on a pair of laterally spaced apart and parallel extending belts,
detector means for detecting any off centering of the wafer at the work station, and
centering means for realigning an off center wafer with the center of the work station,
said centering means comprising,
a curved surface engagable with an edge of the wafer and shaped to permit the wafer to be rotated and shifted laterally and
drive means for driving the belts at a relatively slow speed with the wafer engaged with the curved surface until the wafer is centered.

* * * * *